(12) United States Patent
Udono et al.

(10) Patent No.: US 9,181,607 B2
(45) Date of Patent: Nov. 10, 2015

(54) APPARATUS AND METHOD FOR PRODUCING MG(2)SI(1-X)SN(X) POLYCRYSTAL

(75) Inventors: Haruhiko Udono, Hitachi (JP); Yohiko Mito, Tokyo (JP)

(73) Assignees: IBARAKI UNIVERSITY, Ibaraki (JP); SHOWA KDE CO., LTD., Tokyo (JP)

( * ) Notice: Subject to any disclaimer, the term of this patent is extended or adjusted under 35 U.S.C. 154(b) by 227 days.

(21) Appl. No.: 13/634,937

(22) PCT Filed: Mar. 16, 2011

(86) PCT No.: PCT/JP2011/057064
§ 371 (c)(1),
(2), (4) Date: Oct. 31, 2012

(87) PCT Pub. No.: WO2011/115297
PCT Pub. Date: Sep. 22, 2011

(65) Prior Publication Data
US 2013/0199337 A1    Aug. 8, 2013

(30) Foreign Application Priority Data

Mar. 17, 2010   (JP) ................. 2010-061267

(51) Int. Cl.
*C22C 1/02* (2006.01)
*F27D 99/00* (2010.01)
(Continued)

(52) U.S. Cl.
CPC ............. *C22C 1/02* (2013.01); *C04B 35/58085* (2013.01); *C04B 35/806* (2013.01);
(Continued)

(58) Field of Classification Search
USPC ..................... 75/600, 690; 266/200
See application file for complete search history.

(56) References Cited

FOREIGN PATENT DOCUMENTS

| JP | 2005-133202 | 5/2005 |
|---|---|---|
| JP | 2006-124728 | 5/2006 |
| JP | 2006-128235 | 5/2006 |

OTHER PUBLICATIONS

Morris, R.G., "Semiconducting Properties of $Mg_2$ Si Single Crystals," Physical Review, vol. 109, No. 6, Mar. 15, 1958, pp. 1909-1915.
(Continued)

*Primary Examiner* — Kaj K Olsen
*Assistant Examiner* — Alexander Polyansky
(74) *Attorney, Agent, or Firm* — Preti Flaherty Beliveau & Pachios LLP

(57) ABSTRACT

Provided are an apparatus and a method for producing an inexpensive $Mg_2Si_{1-x}Sn_x$ polycrystal that can be effectively used as thermoelectric conversion materials that can be expected to have a high performance index by doping if necessary.

A problem can be solved by a production apparatus 1 for producing an $Mg_2Si_{1-x}Sn_x$ polycrystal including at least a reaction vessel for synthesis of $Mg_2Si_{1-x}Sn_x$ represented by the following formula (1) by filling a mixture of Mg particles and Si particles or Mg particles and Sn particles, or Mg—Si alloy particles or Mg—Sn alloy particles as a main starting material 2 to cause a reaction; an inorganic fiber layer 6 which is fixedly provided above the starting material 2 filled into the reaction vessel 3 and has air permeability, which can be caused to disappear by a product 7 generated by chemical reaction of vaporized Mg with oxygen during the synthesis of the polycrystal 12; heating means 8 for heating the reaction vessel 3; and control means 9 for controlling the heating temperature and heating time of the reaction vessel 3, wherein $$Mg_2Si_{1-x}Sn_x \qquad (1)$$

(in the formula (1), x is 0 to 1).

13 Claims, 11 Drawing Sheets

(51) Int. Cl.
    C04B 35/58    (2006.01)
    C04B 35/80    (2006.01)
    C22C 23/00    (2006.01)
    H01L 35/20    (2006.01)
    H01L 35/34    (2006.01)

(52) U.S. Cl.
    CPC ............ C22C 23/00 (2013.01); F27D 99/00 (2013.01); H01L 35/20 (2013.01); H01L 35/34 (2013.01); *C04B 2235/40* (2013.01); *C04B 2235/401* (2013.01); *C04B 2235/526* (2013.01); *C04B 2235/5228* (2013.01); *C04B 2235/5264* (2013.01); *C04B 2235/80* (2013.01)

(56) References Cited

OTHER PUBLICATIONS

Heller, M.W., "Seebeck Effect in $Mg_2Si$ Single Crystals," J. Phys. Chem. Solids, Pergamon Press 1962, vol. 23, pp. 601-610.

Yoshinaga, M., "Bulk Crystal Growth of $Mg_2Si$ by the Vertical Bridgman Method," Department of Materials Science and Technology, Tokyo University of Science, Science Direct, Thin Solid Films 461, 2004, pp. 86-89.

FIG. 3 (a)
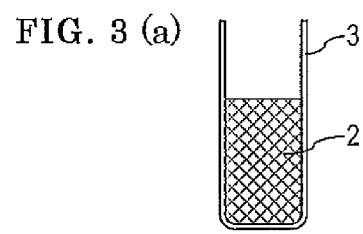
FIG. 3 (b-1)
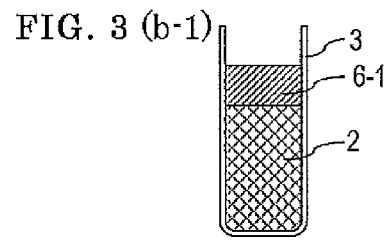
FIG. 3 (b-2)
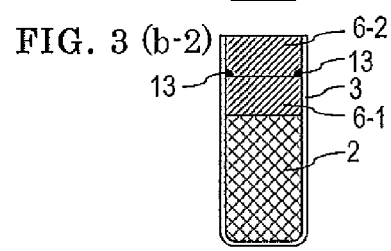
FIG. 3 (c)
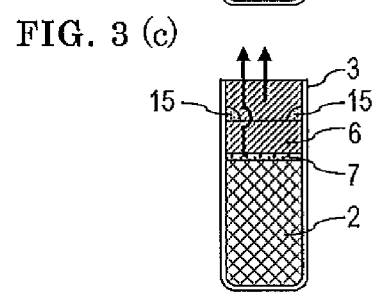
FIG. 3 (d)
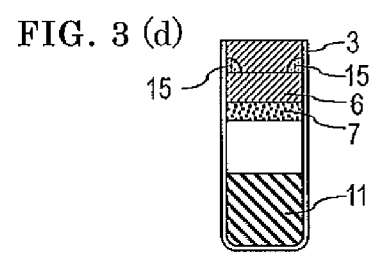
FIG. 3 (e)
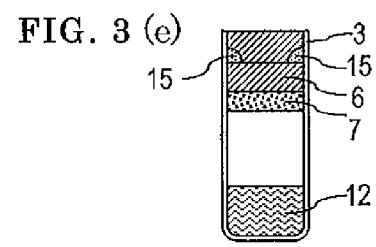
FIG. 3 (f)
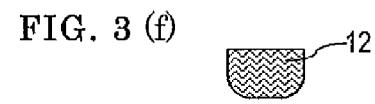

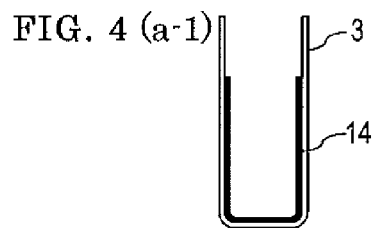
FIG. 4 (a-1)
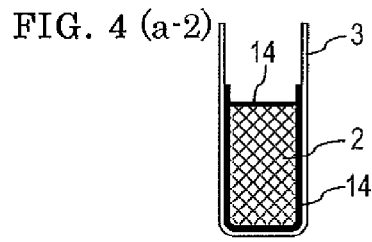
FIG. 4 (a-2)
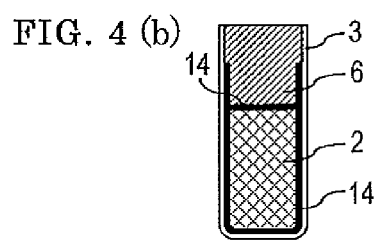
FIG. 4 (b)
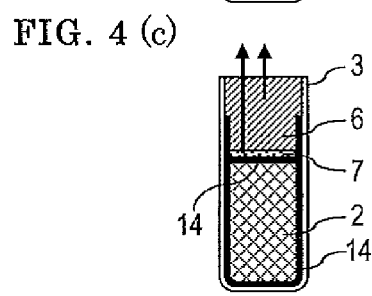
FIG. 4 (c)
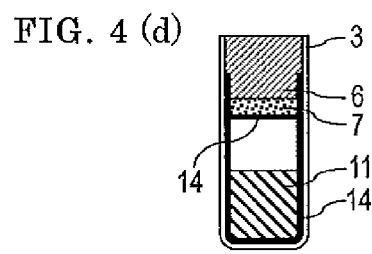
FIG. 4 (d)
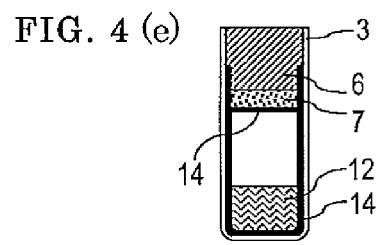
FIG. 4 (e)
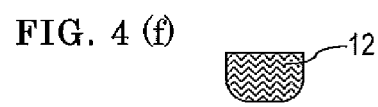
FIG. 4 (f)

EXAMPLE 1    XRD of Mg₂Si GROWTH CRYSTAL

EXAMPLE 4    XRD of Mg$_2$Si PRODUCT

EXAMPLE 5    XRD of Mg₂Si PRODUCT

XRD of PRODUCT OBTAINED IN COMPARATIVE EXAMPLE 1

APPARATUS AND METHOD FOR PRODUCING MG(2)SI(1-X)SN(X) POLYCRYSTAL

TECHNICAL FIELD

The present invention relates to an apparatus and a method for producing an $Mg_2Si_{1-x}Sn_x$ polycrystal, and particularly to an apparatus and a method for producing an $Mg_2Si_{1-x}Sn_x$ (wherein x is 0 or more and 1 or less) polycrystal that can be effectively used as thermoelectric conversion materials that can be expected to have a high performance index by doping if necessary.

BACKGROUND ART

In recent years, the development of a power generating system using waste heat generated from plant facilities and power generating facilities is increased to build an energy saving society. In particular, accompanying increased industrial wastes and the like, the effective utilization of waste heat generated during the incineration thereof becomes an issue. For example, in a large-scale waste incineration facility, waste heat is recovered by heating a boiler with the waste heat, and generating electricity with a steam turbine. However, since small-scale and middle-scale waste incineration facilities which account for a large majority have high dependency on the advantage of scale, a method for generating electricity with a turbine cannot be utilized.

Therefore, as such a method for generating electricity with waste heat, a thermoelectric conversion element using a thermoelectric conversion material which reversibly performs thermoelectric conversion by utilizing the Seebeck effect or the Peltier effect has been proposed.

Further, $Mg_2Si$ which is nontoxic and present in a rich amount and has little environmental impact (e.g., see Non-patent Literatures 1, 2, and 3) has been studied as the thermoelectric conversion material. However, since in terms of production, it has disadvantage such as danger due to high chemical reactivity of Mg, synthesis in vacuum or in inert gases is required. Therefore, there have been problems such as about 8-hour preparation, trouble in synthesis, and expensiveness. Further, since unreacted Mg and Si elements remain in the synthesized $Mg_2Si$, there have been problems such as low thermoelectric conversion performance and short life span.

CITATION LIST

Non-Patent Literature

Non-Patent Literature 1: Semiconducting Properties of $Mg_2Si$ Single Crystals Physical Review Vol. 109, No. 6 Mar. 15, 1958, P. 1909-1915

Non-Patent Literature 2: Seebeck Effect In $Mg_2Si$ Single Crystals J. Phys. Chem. Solids Pergamon Press 1962. Vol. 23, pp. 601-610

Non-Patent Literature 3: Bulk crystal growth of $Mg_2Si$ by the vertical Bridgman method Science Direct Thin Solid Films 461(2004) 86-89

DISCLOSURE OF INVENTION

Problem to be Solved by the Invention

A first object of the present invention is to provide an apparatus for producing an inexpensive $Mg_2Si_{1-x}Sn_x$ polycrystal that is a polycrystal formed only of an $Mg_2Si_{1-x}Sn_x$ crystal and can be effectively used as a thermoelectric conversion material that can be expected to have a high performance index at a middle temperature of about 300 to 600° C. by adding a certain amount of dopant and firing, if necessary.

A second object of the present invention is to provide a method for producing such an $Mg_2Si_{1-x}Sn_x$ polycrystal with ease and safe in a short time without using an expensive vacuum device, an inert gas introduction device, a sealing device, and the like.

Means for Solving Problem

In order to solve the above-mentioned problems, an invention according to a first aspect of the present invention is an apparatus for producing an $Mg_2Si_{1-x}Sn_x$ polycrystal, including at least: a reaction vessel for synthesizing an $Mg_2Si_{1-x}Sn_x$ polycrystal represented by the following formula (1) by charging a mixture of Mg particles and Si particles or Mg particles and Sn particles, or Mg—Si alloy particles or Mg—Sn alloy particles as a main starting material to cause a reaction; an inorganic fiber layer which is fixedly provided above the starting material charged into the reaction vessel and has air permeability, and in which the air permeability can be caused to disappear by a product generated by chemical reaction of vaporized Mg with oxygen during the synthesis of the polycrystal; heating means for heating the reaction vessel; and control means for controlling the heating temperature and heating time of the reaction vessel,

$$Mg_2Si_{1-x}Sn_x \quad (1)$$

(in the formula (1), x is 0 to 1).

An invention according to a second aspect of the present invention is the production apparatus according to the first aspect, wherein the inorganic fiber layer includes an upper inorganic fiber layer and a lower inorganic fiber layer, and has Mg particles disposed on the whole surroundings of portions which are between the upper and lower inorganic fiber layers and in which the layers come into contact with the inner wall face of the reaction vessel.

An invention according to a third aspect of the present invention is the production apparatus according to the first or second aspect, wherein the reaction vessel has a release layer on the inner wall face in contact with at least the starting material.

An invention according to a fourth aspect of the present invention is the production apparatus according to any one of the first to third aspects, wherein the reaction vessel has a release layer on the starting material so as to cover the whole starting material.

An invention according to a fifth aspect of the present invention is a method for producing an $Mg_2Si_{1-x}Sn_x$ polycrystal represented by the following formula (1) in air using the production apparatus according to the first aspect in accordance with the following steps (1) to (8):

(1) preparing a main starting material which contains a mixture of Mg particles and Si particles or Mg particles and Sn particles, or Mg—Si alloy particles or Mg—Sn alloy particles so as to have an element ratio of Mg:Si or Sn of (2+α):1;

(2) charging the starting material prepared in the step (1) into the reaction vessel;

(3) forming the inorganic fiber layer which is fixedly provided above the starting material charged into the reaction vessel and has air permeability, and in which the air permeability can be caused to disappear by a product generated by chemical reaction of vaporized Mg with oxygen during the synthesis of the polycrystal;

(4) heating the whole reaction vessel having the inorganic fiber layer formed in the step (3) and raising the reaction vessel to approximately 650° C. that is the melting point of Mg in a short time to rapidly discharge the most of air existing in a space ranging from the upper face of the starting material to the upper face of the inorganic fiber layer outside the system;

(5) causing the air permeability of the inorganic fiber layer to disappear during heating of the whole reaction vessel to a temperature equal to or lower than the maximum use temperature of the inorganic fiber layer in a short time even after the rapid discharge of the most of air outside the system in the step (4);

(6) heating the whole reaction vessel continuously after causing the air permeability of the inorganic fiber layer to disappear, maintaining the whole reaction vessel to the temperature equal to lower than the maximum use temperature of the inorganic fiber layer, and reacting Mg with Si or Sn in a short time to produce a melt of an $Mg_2Si_{1-x}Sn_x$ polycrystal;

(7) cooling the melt of the $Mg_2Si_{1-x}Sn_x$ polycrystal produced in the step (6) in a short time to precipitate the $Mg_2Si_{1-x}Sn_x$ polycrystal; and (8) taking the $Mg_2Si_{1-x}Sn_x$ polycrystal precipitated in the step (7) from the reaction vessel $$Mg_2Si_{1-x}Sn_x \quad (1)$$

(in the formula (1), x is 0 to 1).

An invention according to a sixth aspect of the present invention is the production method according to the fifth aspect, wherein the reaction vessel is impervious to oxygen and heat resistant to the chemical reaction temperature of Mg with Si or Sn in air, and has a characteristic in which impurities are not supplied to the $Mg_2Si_{1-x}Sn_x$ polycrystal being a product.

An invention according to a seventh aspect of the present invention is the production method according to the fifth or sixth aspect, wherein it takes 15 minutes to 4 hours to precipitate the $Mg_2Si_{1-x}Sn_x$ polycrystal in the steps (2) to (8).

An invention according to an eighth aspect of the present invention is the production method according to any one of the fifth to seventh aspects, wherein Mg is reacted with Si or Sn with stirring to produce the melt of the $Mg_2Si_{1-x}Sn_x$ polycrystal.

An invention according to a ninth aspect of the present invention is the production method according to any one of the fifth to eighth aspects, wherein the inorganic fiber layer includes an upper inorganic fiber layer and a lower inorganic fiber layer, and has Mg particles disposed on the whole surroundings of portions which are between the upper and lower inorganic fiber layers and in which the layers come into contact with the inner wall face of the reaction vessel.

An invention according to a tenth aspect of the present invention is the production method according to any one of the fifth to ninth aspects, wherein the reaction vessel has a release layer on the inner wall face in contact with at least the starting material.

An invention according to an eleventh aspect of the present invention is the production method according to any one of the fifth to tenth aspects, wherein in the step (2), the reaction vessel is filled with the starting material prepared in the step (1), and the release layer is provided on the starting material so as to cover the whole starting material.

Advantageous Effects of the Invention

The apparatus for producing an $Mg_2Si_{1-x}Sn_x$ polycrystal according to the first aspect of the present invention does not use an expensive vacuum device, an inert gas introduction device, a sealing device, or the like, but can produce an $Mg_2Si_{1-x}Sn_x$ polycrystal with ease and safe in a short time. The produced $Mg_2Si_{1-x}Sn_x$ polycrystal has a remarkable effect such as effective utilization as an inexpensive thermoelectric conversion material that can be expected to have a high performance index and a long life span by adding a certain amount of dopant and firing, if necessary.

Specific examples of the $Mg_2Si_{1-x}Sn_x$ polycrystal represented by the above-described formula (1) include an $Mg_2Si_{1-x}Sn_x$ three-element mixed polycrystal, an $Mg_2Si$ polycrystal, and an $Mg_2Sn$ polycrystal.

The invention according to the second aspect of the present invention is the production apparatus according to the first aspect, wherein the inorganic fiber layer includes the upper inorganic fiber layer and the lower inorganic fiber layer, and has Mg particles disposed on the whole surroundings of portions which are between the upper and lower inorganic fiber layers and in which the layers come into contact with the inner wall face of the reaction vessel. Therefore, the production apparatus has remarkable effects in which the inorganic fiber layer is fixed to the inner wall face of the reaction vessel more rigidly due to the product produced by melting the disposed Mg particles and reacting the melted Mg particles with oxygen, and Mg vapor does not leak from a gap between the inorganic fiber layer and the inner wall face of the reaction vessel.

The invention according to the third aspect of the present invention is the production apparatus according to the first or second aspect, wherein the reaction vessel has the release layer on the inner wall face in contact with at least the starting material. Since the release layer is provided, the production apparatus has a further remarkable effect in which the $Mg_2Si_{1-x}Sn_x$ polycrystal can be easily taken from the reaction vessel.

The invention according to the fourth aspect of the present invention is the production apparatus according to any one of the first to third aspects, wherein the reaction vessel has the release layer on the starting material so as to cover the whole starting material. Thus, the production apparatus has a further remarkable effect in which, when the starting material is melted to decrease the volume of the starting material, the release layer provided between the starting material and the inorganic fiber layer is separated from the inorganic fiber layer and moves to follow the starting material, and protects the starting material.

The invention according to the fifth aspect of the present invention is a method for producing an $Mg_2Si_{1-x}Sn_x$ polycrystal in air using the production apparatus according to the first aspect in accordance with the above-descried steps (1) to (8). Therefore, the production method has a remarkable effect in which the $Mg_2Si_{1-x}Sn_x$ polycrystal can be produced with ease and safe in a short time without using an expensive vacuum device, an inert gas introduction device, a sealing device, or the like.

The invention according to the sixth aspect of the present invention is the production method according to the fifth aspect, wherein the reaction vessel is impervious to oxygen and heat resistant to the chemical reaction temperature of Mg with Si or Sn in air, and has a characteristic in which impurities are not supplied to the $Mg_2Si_{1-x}Sn_x$ polycrystal being a product. Therefore, the production method has a further remarkable effect in which the $Mg_2Si_{1-x}Sn_x$ polycrystal can be surely produced with ease and safe.

The invention according to the seventh aspect of the present invention is the production method according to the fifth or sixth aspect, wherein it takes 15 minutes to 4 hours to precipitate the $Mg_2Si_{1-x}Sn_x$ polycrystal in the steps (2) to (8). Therefore, the production method has a further remarkable effect in which the $Mg_2Si_{1-x}Sn_x$ polycrystal can be surely produced in a short time.

The invention according to the eighth aspect of the present invention is the production method according to any one of the fifth to seventh aspects, wherein Mg is reacted with Si or Sn with stirring to produce the melt of the $Mg_2Si_{1-x}Sn_x$ polycrystal. Therefore, the production method has a further remarkable effect in which the $Mg_2Si_{1-x}Sn_x$ polycrystal can be surely produced in a short time.

The invention according to the ninth aspect of the present invention is the production method according to any one of the fifth to eighth aspects, wherein the inorganic fiber layer includes the upper inorganic fiber layer and the lower inorganic fiber layer, and has Mg particles disposed on the whole surroundings of portions which are between the upper and lower inorganic fiber layers and in which the layers come into contact with the inner wall face of the reaction vessel. Therefore, the production method has remarkable effects in which the inorganic fiber layer is fixed to the inner wall face of the reaction vessel more rigidly due to the product produced by melting the disposed Mg particles and reacting the melted Mg particles with oxygen, and Mg vapor does not leak from a gap between the inorganic fiber layer and the inner wall face of the reaction vessel.

The invention according to the tenth aspect of the present invention is the production method according to any one of the fifth to ninth aspects, wherein the reaction vessel has the release layer on the inner wall face in contact with at least the starting material. Since the release layer is provided, the production method has a further remarkably effect in which the $Mg_2Si_{1-x}Sn_x$ polycrystal can be easily taken from the reaction vessel.

The invention according to the eleventh aspect of the present invention is the production method according to any one of the fifth to tenth aspects, wherein in the step (2), the reaction vessel is filled with the starting material prepared in the step (1), and the release layer is disposed on the starting material so as to cover the whole starting material. Thus, the production method has a further remarkable effect in which, when the starting material is melted to decrease the volume of the starting material, the release layer provided between the starting material and the inorganic fiber layer is separated from the inorganic fiber layer and moves to follow the starting material, and protects the starting material.

BRIEF DESCRIPTION OF DRAWINGS

FIG. 3 includes explanatory views illustrating another example of a production method of the present invention for producing an $Mg_2Si$ polycrystal or an $Mg_2Sn$ polycrystal in air using the production apparatus of the present invention.

FIG. 4 includes explanatory views illustrating further another example of a production method of the present invention for producing an $Mg_2Si$ polycrystal or an $Mg_2Sn$ polycrystal in air using the production apparatus of the present invention.

BEST MODE(S) FOR CARRYING OUT THE INVENTION

Hereinafter, embodiments of the present invention will be described in detail with reference to the drawings.

Figure 1:
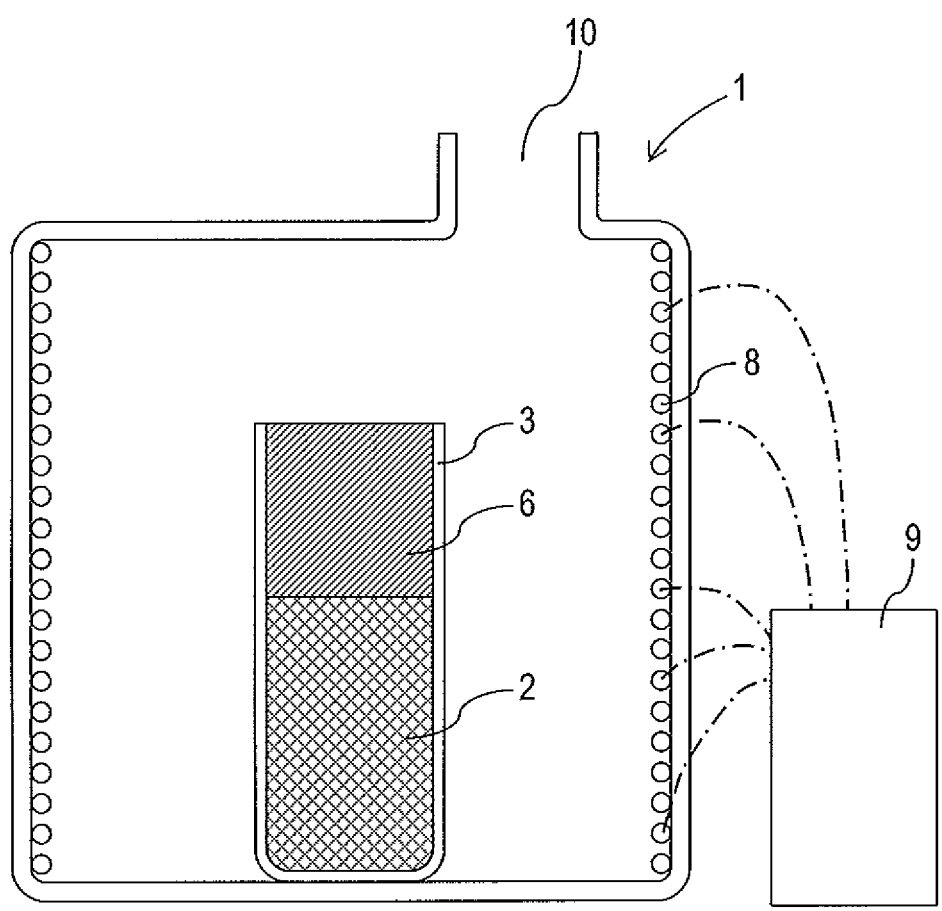
FIG. 1 is an explanatory view illustrating an apparatus for producing an $Mg_2Si$ polycrystal or an $Mg_2Sn$ polycrystal of the present invention.

FIG. 1 is the explanatory view illustrating the apparatus for producing an $Mg_2Si$ polycrystal or an $Mg_2Sn$ polycrystal of the present invention.

In FIG. 1, the reference numeral 1 represents the production apparatus of the present invention, and the reference numeral 2 represents a main starting material such as a mixture of Mg particles and Si particles or Mg particles and Sn particles, or Mg—Si alloy particles or Mg—Sn alloy particles.

The reference numeral 3 represents a reaction vessel in which a predetermined amount of the starting material 2 is charged and reacted to synthesize an $Mg_2Si$ polycrystal or an $Mg_2Sn$ polycrystal.

The reference numeral 6 represents an inorganic fiber layer fixedly provided in the upper part of the reaction vessel 3 and having an air permeability.

While not shown in FIG. 1, a release layer 14 having heat resistance and formed of a carbon sheet, a BN sheet, a carbon coating, or a carbon plate can be disposed so as to cover the upper face of the starting material 2 charged into the reaction vessel 3. While not shown FIG. 1, a space 5 having a predetermined volume can be provided above the starting material 2 in the reaction vessel 3.

The inorganic fiber layer 6 is configured to cause its air permeability to disappear by reacting vaporized Mg with oxygen as described below until an $Mg_2Si$ polycrystal or an $Mg_2Sn$ polycrystal is synthesized, and precipitating a product 7 (not shown in FIG. 1) between inorganic fibers.

The reference numeral 8 represents heating means for heating the reaction vessel 3, such as a heater, and the reference numeral 9 represents control means for controlling the heating temperature and heating time of the reaction vessel 3. The reference numeral 10 represents an opening part disposed above the reaction vessel 3 through the air.

Figure 2:
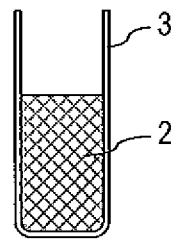
FIG. 2 includes explanatory views illustrating an example of a production method of the present invention for producing an $Mg_2Si$ polycrystal or an $Mg_2Sn$ polycrystal in air using the production apparatus of the present invention.
Figure 2:
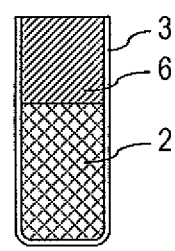
Figure 2:
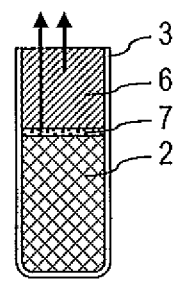
Figure 2:
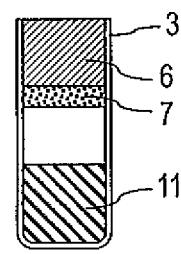
Figure 2:
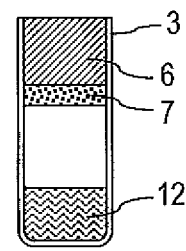
Figure 2:

FIG. 2 includes the explanatory views illustrating an example of the production method of the present invention for producing an $Mg_2Si$ polycrystal or an $Mg_2Sn$ polycrystal in air using the production apparatus of the present invention.

FIG. 2(a) represents the reaction vessel 3 which is filled with a predetermined amount of the main starting material 2 such as a mixture of Mg particles and Si particles or Mg particles and Sn particles, or Mg—Si alloy particles or Mg—Sn alloy particles, which is prepared so as to have an element ratio of Mg:Si or Sn of (2+α): 1.

When the $Mg_2Si_{1-x}Sn_x$ polycrystal represented by the following formula (1) is produced, Sn particles, in addition to Mg particles and Si particles, are mixed as starting materials so that x falls within a range of 0 to 1.

$$Mg_2Si_{1-x}Sn_x \qquad (1)$$

(In the formula (1), x is 0 to 1.)

FIG. 2(b) is an explanatory view illustrating a state in which the inorganic fiber layer 6 having air permeability is fixedly provided above the starting material 2 charged into the reaction vessel 3.

As described below, the inorganic fiber layer 6 having air permeability is configured such that the air permeability is caused to disappear due to the product 7 produced by chemical reaction of vaporized Mg with oxygen until the polycrystal is synthesized.

FIG. 2(c) is an explanatory view illustrating a situation in which the most of air existing in a space ranging from the upper face of the starting material 2 to the upper face of the inorganic fiber layer 6 is rapidly discharged in the direction of an arrow outside the system by heating the whole reaction vessel 3 having the inorganic fiber layer 6 by means of the heating means 8 operated by a signal from the control means 9 and raising the reaction vessel to approximately 650° C. that is the melting point of Mg in a short time.

A time required to raise the reaction vessel to approximately 650° C. that is the melting point of Mg is different depending on the size of the reaction vessel 3, the kind of an inorganic fiber, the density or thickness of the inorganic fiber layer 6, or the like. In general, it is preferably 15 minutes or longer, and more preferably 30 minutes or longer. When the time is shorter than 15 minutes, the most of the air may not be rapidly discharged outside the system.

When the most of the air is discharged outside the system by heating, a risk of explosion caused by static electricity generated by collision of fine powders such as Mg particles being the starting material can be eliminated. Further, when the air is discharged outside the system, a risk of explosion can be eliminated or reduced even during generation of vaporized Mg by additional heating, as described below.

FIG. 2(d) is an explanatory view illustrating the following process. In the process, when the whole reaction vessel 3 is heated to a temperature equal to or lower than the maximum use temperature of the inorganic fiber layer 6 in a short time by the heating means 8 operated by a signal from the control means 9 after the rapid discharge of the most of the air outside the system, Mg in an amount corresponding to α is vaporized, and the vaporized Mg moistens and adheres to the fiber surface of the inorganic fiber layer 6. The Mg is reacted with residual oxygen remaining in the space ranging from the upper face of the starting material 2 to the upper face of the inorganic fiber layer 6 and oxygen in inorganic fibers to form an oxide film of MgO and Mg—Si—O as the product 7 on the fiber surface, whereby the oxide film blocks external oxygen to cause the air permeability of the inorganic fiber layer 6 to disappear.

A time required for heating to the temperature equal to or lower than the maximum use temperature is different depending on the size of the reaction vessel 3, the kind of the inorganic fiber, the density or thickness of the inorganic fiber layer 6, or the like. In general, it is preferably 5 minutes or longer, and more preferably 10 minutes or longer. When the time is shorter than 5 minutes, the air permeability of the inorganic fiber layer 6 may not be caused to disappear.

Even before the air permeability of the inorganic fiber layer 6 is caused to disappear, the whole reaction vessel 3 is continuously heated, and therefore, the pressure in the reaction vessel 3 cannot be reduced. Accordingly, low-temperature external air may not enter a space ranging from the upper face of the starting material 2 to the external surface of the inorganic fiber layer 6 from the outside of the system.

When the air permeability of the inorganic fiber layer 6 is caused to disappear due to the product 7 produced finally, fresh air does not enter from the outside of the system. As a result, the absence of oxygen in the system eliminates a risk of explosion in the system even when the vaporized Mg is generated. Further, since the vaporized Mg does not leak outside the system, a risk of explosion outside the system can be surely eliminated.

As shown in FIG. 2(d), even after the air permeability of the inorganic fiber layer 6 is caused to disappear, the whole reaction vessel 3 is continuously heated and maintained to the temperature equal to lower than the maximum use temperature of the inorganic fiber layer, and Mg is reacted with Si or Sn in a short time to produce a melt 11 of $Mg_2Si$ or $Mg_2Sn$.

A time required for the chemical reaction is different depending on the size of the reaction vessel 3, the reaction temperature, or the like. In general, it is preferably 5 minutes or longer, and more preferably 15 minutes or longer. When the time is shorter than 5 minutes, the reaction of Mg with Si or Sn may not be completed.

FIG. 2(e) is an explanatory view illustrating a process of cooling the produced melt of $Mg_2Si$ or $Mg_2Sn$ in a short time to precipitate an $Mg_2Si$ polycrystal or an $Mg_2Sn$ polycrystal.

A time required for the cooling is different depending on the size of the reaction vessel 3, the cooling rate, or the like. In general, it is preferably 10 to 300 minutes, and more preferably 15 to 30 minutes. When the time is shorter than 10 minutes, the cooling rate becomes high, and as a result, a crucible in the reaction vessel 3 may be broken.

Even when the cooling time is 300 minutes, the crucible of the reaction vessel 3 may be broken depending on the properties or size of the reaction vessel 3. In this case, the reaction vessel 3 may be cooled by natural cooling over about 24 hours exceeding 300 minutes as the cooling time.

FIG. 2(f) is an explanatory view illustrating a situation in which the $Mg_2Si$ polycrystal or $Mg_2Sn$ polycrystal 12 precipitated in the reaction vessel 3 is taken from the reaction vessel 3.

In the present invention, a time required for precipitation of the $Mg_2Si$ polycrystal or $Mg_2Sn$ polycrystal in the steps (2) to (8) is the sum of the times in steps 4, 5, 6, and 7. The time is different depending on the size of the reaction vessel 3, the reaction amount, the reaction temperature, the kind of the inorganic fiber, the density or thickness of the inorganic fiber layer 6, the cooling rate, or the like. In general, if the reaction vessel 3 is small, the reaction amount is small, and the density and thickness of the inorganic fiber layer 6 are low, the time is about 15 minutes, and if the reaction vessel 3 is large, the reaction amount is large, and the density and thickness of the inorganic fiber layer 6 are high, the time is about 4 hours. By selecting an appropriate condition, an $Mg_2Si$ polycrystal or an $Mg_2Sn$ polycrystal can be surely produced in a short time without remaining unreacted starting materials and causing side reactions.

Figure 5:
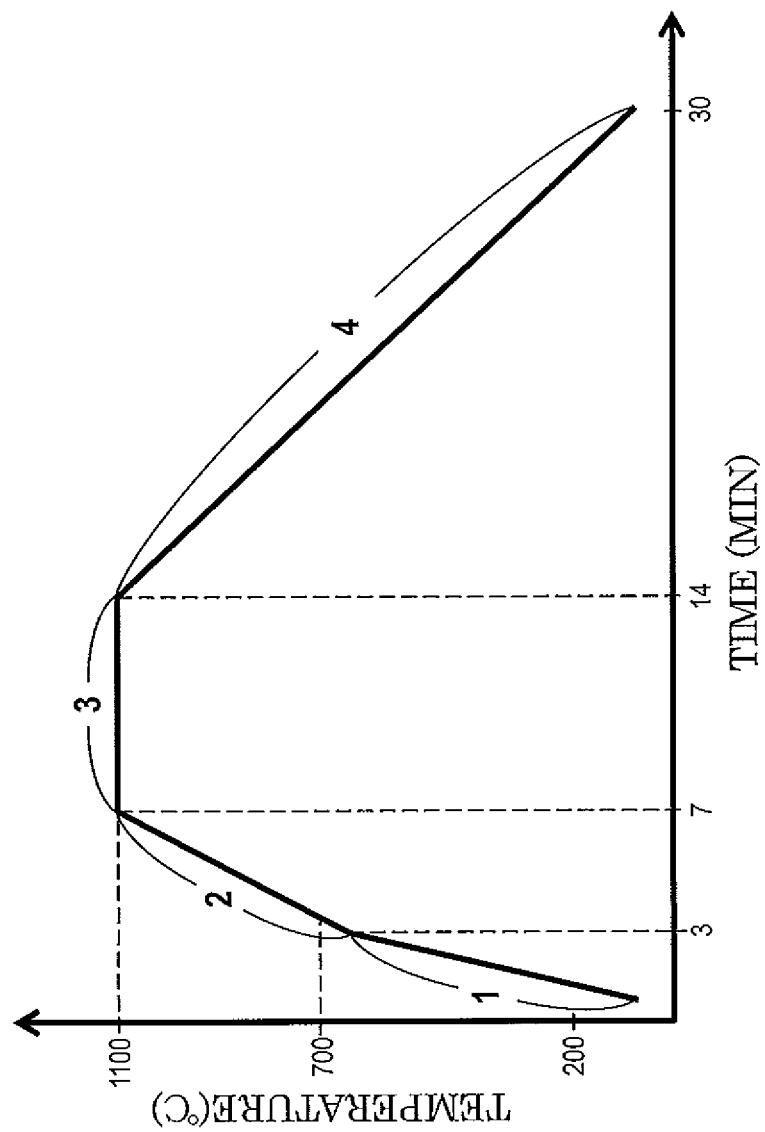
FIG. 5 is an explanatory view illustrating an exemplary relation between times (minute) and temperatures (° C.) in the steps 4, 5, 6, and 7.

FIG. 5 is the explanatory view illustrating an exemplary relation between times (minute) and temperatures (° C.) in the steps 4, 5, 6, and 7. The reference numeral 1 represents a time in the step 4 (time required to raise the reaction vessel to approximately 650° C. that is the melting point of Mg), the reference numeral 2 represents a time in the step 5 (time required for heating to a temperature equal to or lower than the maximum use temperature of the inorganic fiber layer), the reference numeral 3 represents a time in the step 6 (time required for the chemical reaction), and the reference numeral 4 represents a time in the step 7 (cooling time).

FIG. 3 includes the explanatory views illustrating further another example of the production method of the present invention for producing an $Mg_2Si$ polycrystal or an $Mg_2Sn$ polycrystal in air using the production apparatus 1 of the present invention.

FIG. 3(*a*) represents a reaction vessel 3 which is filled with a predetermined amount of the main starting material 2, as with FIG. 2(*a*).

FIG. 3(*b*-1) is an explanatory view illustrating a state in which a lower inorganic fiber layer 6-1 having air permeability is fixedly provided above the starting material 2 charged into the reaction vessel 3.

FIG. 3(*b*-2) is an explanatory view illustrating a state in which Mg particles 13 are disposed on the whole surroundings of portions which are above the lower inorganic fiber layer 6-1 and in which the lower inorganic fiber layer 6-1 comes into contact with the inner wall face of the reaction vessel, and then an upper inorganic fiber layer 6-2 is fixedly provided above the Mg particles 13, whereby the inorganic fiber layer 6 is fixedly provided.

The lower inorganic fiber layer 6-1 and the upper inorganic fiber layer 6-2 may be formed of the same inorganic fiber or different inorganic fibers.

As described below, the inorganic fiber layer 6 having air permeability is configured such that its air permeability is caused to disappear due to a product 7 produced by chemical reaction of vaporized Mg with oxygen until the polycrystal is synthesized.

As with FIG. 2(*c*), FIG. 3(*c*) is a view illustrating a situation in which the most of air existing in a space ranging from the upper face of the starting material 2 to the upper face of the inorganic fiber layer 6 is rapidly discharged in the direction of an arrow outside the system by heating the whole reaction vessel 3 having the inorganic fiber layer 6 by the heating means 8 operated by a signal from the control means 9 and raising the reaction vessel to approximately 650° C. that is the melting point of Mg in a short time.

As with FIG. 2(*d*), FIG. 3(*d*) is an explanatory view illustrating the following process. In the process, when the whole reaction vessel 3 is heated to a temperature equal to or lower than the maximum use temperature of the inorganic fiber layer 6 in a short time by the heating means 8 operated by a signal from the control means 9 after the rapid discharge of the most of the air outside the system, Mg in an amount corresponding to α is vaporized, and the vaporized Mg moistens and adheres to the fiber surface of the inorganic fiber layer 6. The Mg is reacted with residual oxygen remaining in the space ranging from the upper face of the starting material 2 to the upper face of the inorganic fiber layer 6 and oxygen in inorganic fibers to form an oxide film of MgO and Mg—Si—O as the product 7 on the fiber surface, whereby the oxide film blocks external oxygen to cause the air permeability of the inorganic fiber layer 6 to disappear.

The inorganic fiber layer 6 is fixed to the inner wall face of the reaction vessel 3 more rigidly due to a product 15, such as magnesium oxide, produced by melting the disposed Mg particles and reacting the melted Mg particles with oxygen, and Mg vapor does not leak from a gap between the inorganic fiber layer 6 and the inner wall face of the reaction vessel 3.

As shown in FIG. 3(*d*), even after the air permeability of the inorganic fiber layer 6 is caused to disappear, the whole reaction vessel 3 is continuously heated and maintained to the temperature equal to lower than the maximum use temperature of the inorganic fiber layer 6, and Mg is reacted with Si or Sn in a short time to produce a melt 11 of $Mg_2Si$ or $Mg_2Sn$.

As with FIG. 2(*e*), FIG. 3(*e*) is an explanatory view illustrating a process of cooling the produced melt of the $Mg_2Si$ or $Mg_2Sn_x$ in a short time to precipitate an $Mg_2Si$ polycrystal or an $Mg_2Sn$ polycrystal.

As with FIG. 2(*f*), FIG. 3(*f*) is an explanatory view illustrating a situation in which the $Mg_2Si$ polycrystal or $Mg_2Sn$ polycrystal 12 precipitated in the reaction vessel 3 is taken from the reaction vessel 3.

FIG. 4 includes the explanatory views illustrating further another example of the production method of the present invention for producing an $Mg_2Si$ polycrystal or an $Mg_2Sn$ polycrystal in air using the production apparatus 1 of the present invention.

FIG. 4(*a*-1) is an explanatory view illustrating a reaction vessel 3 having a release layer 14 having heat resistance and formed of a carbon sheet, a BN sheet, a carbon coating, or a carbon plate, on the inner wall face in contact with at least the starting material 2.

FIG. 4(*a*-2) is an explanatory view illustrating the reaction vessel 3 in which the reaction vessel 3 having the release layer 14 is filled with a predetermined amount of the starting material 2 as with FIG. 2(*a*), and the release layer 14 having heat resistance and formed of a carbon sheet, a BN sheet, a carbon coating, or a carbon plate is provided on the starting material 2.

The description in FIGS. 4(*b*) to 4(*f*) is omitted since FIGS. 4(*b*) to 4(*f*) are the same in FIGS. 2(*b*) to 2(*f*).

Since at least the reaction vessel 3 has the release layer 14 having heat resistance and formed of a carbon sheet, a BN sheet, a carbon coating, or a carbon plate, on the inner wall face in contact with the starting material 2, an $Mg_2Si_{1-x}Sn_x$ polycrystal can be taken from the reaction vessel 3 without breaking the reaction vessel 3.

When the starting material 2 is melted to decrease the volume of the starting material 2, the release layer 14 which has heat resistance, is formed of a carbon sheet, a BN sheet, a carbon coating, and a carbon plate, and is disposed so as to cover the upper face of the starting material 2 charged into the reaction vessel 3 follows the starting material 2, and covers the upper face of a produced melt. The release layer 14 can be used as long as it is heat resistant to reaction conditions of the chemical reaction, and impervious to vaporized Mg, and has mechanical characteristics.

Examples of the release layer 14 used in the present invention include a carbon sheet, a BN sheet, a carbon coating, or a carbon plate, but the release layer 14 is not limited to these.

Examples of a starting material Si used in the present invention may include chunk-shaped particles with an average particle diameter of about 2 to 3 mm and powders with an average particle diameter of about 5 μm which are obtained by pulverizing a high-purity silicon material for a semiconductor, a high-purity silicon material for an LSI, a high-purity silicon material for a solar cell, a high-purity metallic silicon, or the like.

As a starting material Mg used in the present invention, chunk-shaped particles with a purity of 99.9% or more provided by higher purification, and an average particle diameter of about 2 to 3 mm can be preferably used.

In general, the starting materials, Mg particles and Si particles or Sn particles are mixed so that the element ratio is 2:1.

Mg—Si alloy particles or Mg—Sn alloy particles used in the present invention are particles of an Mg—Si alloy or an Mg—Sn alloy, or particles of an Mg—Si sintered body or an Mg—Sn sintered body. When these are the starting materials, these are usually mixed so that the element ratio is 2:1.

A case of use of Mg particles and Si particles or Sn particles will be described below.

In the present invention, the amount of Mg particles is made larger than a stoichiometric value of $Mg_2Si$ or $Mg_2Sn$ of 2:1 by $\alpha$. This is because gaps between the inorganic fibers are completely closed to cause the air permeability of the inorganic fiber layer 6 to disappear by vaporizing Mg in an amount corresponding to $\alpha$, making the vaporized Mg moisten and adhere to the fiber surface of the inorganic fiber layer 6, reacting the Mg with oxygen remaining in a space ranging from the upper face of the starting material 2 to the upper face of the inorganic fiber layer 6 and oxygen in inorganic fibers to form an oxide film of the produced product 7 (MgO and Mg—S—O) on the inorganic fiber surface.

The value $\alpha$ is deferent depending on the material of the inorganic fiber layer 6, the size of the fibers, the thickness, the density of the fibers, the porosity between the fibers, reaction conditions such as temperature and time, or the like, and it is generally 0.1 to 1% by mole, and preferably 0.2 to 0.5% by mole. If the $\alpha$ is less than 0.1% by mole, Mg is insufficient, Si is residual, and a high-purity $Mg_2Si$ polycrystal or $Mg_2Sn$ polycrystal may not be obtained. On the contrary, if the $\alpha$ exceeds 1% by mole, Mg is residual, and a high-purity $Mg_2Si$ polycrystal or $Mg_2Sn$ polycrystal may not be obtained.

The inorganic fiber used in the present invention may be an inorganic fiber preferably containing $SiO_2$ as an essential component. Specific examples thereof may include bulk fiber FXL (maximum use temperature: 1260° C.), bulk fiber FXL-Z (maximum use temperature: 1450° C.), bulk fiber FMX (brand name, available from Toshiba Monofrax Co., Ltd.) (maximum use temperature: 1600° C.), Isowool 1600 (brand name, available from ISOLITE Insulating Products Co., Ltd.) (maximum use temperature: 1600° C.), Kaowool (maximum use temperature: 1093° C.), KaowoolRT (maximum use temperature: 1093° C.), Cerabianket (maximum use temperature: 1177° C.), Cerachem (maximum use temperature: 1315° C.), Cerachrome (brand name, available from Thermal Ceramics., Inc.) (maximum use temperature: 1371° C.), and the like.

In the present invention, the inorganic fibers may be used singly or an appropriate combination of two or more kinds thereof is selected and used.

The reaction vessel used in the present invention is not particularly limited as long as it is heat resistant to the reaction conditions of the chemical reaction and has mechanical characteristics. The reaction vessel should be impervious to oxygen and heat resistant to the chemical reaction temperature of Mg with Si or Sn in air, should have a characteristic in which impurities are not supplied to the $Mg_2Si_{1-x}Sn_x$ polycrystal being a product, and may have an inner face formed of a material such as alumina, BN, or dandified graphite. A reaction vessel having an inner face formed of BN is preferable since it has an excellent releasing property of a product.

The heating means 8 of the reaction vessel 3 used in the present invention is not particularly limited, and publicly known heating means such as an electric furnace and a gas-fired furnace and a publicly known heating method can be used. A heating pattern of the reaction vessel 3 is also not particularly limited.

However, when an appropriate heating pattern (heating time, heating temperature, etc.) is determined by experiments or experiences, it is preferable that the pattern be made to be inputted and stored in the control means 9, and heating be performed by the heating means 8 operated by a signal from the control means 9.

The pressure may be an atmospheric pressure and the heating temperature is different depending on a synthesized product. When the synthesized product is $Mg_2Sn$, the heating temperature is 770.5° C. (melting point of $Mg_2Sn$) to 850° C., and when it is $Mg_2Si$, the heating temperature is about 1085° C. (melting point of $Mg_2Si$) to 1107° C. (melting point of Mg). However, the upper limit of the heating temperature may be equal to or lower than the maximum use temperature of the inorganic fiber layer. For example, alloying can be performed by heat processing at the heating temperatures for about 15 minutes to 4 hours in total as described above.

When Mg is melted by heating to a temperature equal to or higher than the melting point of Mg (650° C.), Si or Sn is melted into Mg, and a reaction starts.

On the other hand, when the temperature exceeds 1107° C. (boiling point of Mg), Mg may suddenly vaporize and be scattered. Therefore, synthesis requires attention.

Cooling of the obtained melt of $Mg_2Si$ or $Mg_2Sn$ is not particularly limited, and a publicly known cooling device and a publicly known cooling method can be used.

By rapid cooling, the reaction vessel may be broken, and therefore the cooling requires attention.

After the synthesis of $Mg_2Si$ or $Mg_2Sn$, it is cooled to obtain polycrystalline $Mg_2Si$ or $Mg_2Sn$. The cooling may be natural cooling or forced cooling or a combination thereof.

When Mg is reacted with Si or Sn with stirring, an $Mg_2Si_{1-x}Sn_x$ polycrystal can be produced more uniformly in a short time, which is a preferable process. Stirring is not particularly limited, and a publicly known stirring device and a publicly known stirring method can be used.

When an $Mg_2Si_{1-x}Sn_x$ polycrystal is used as a thermoelectric conversion material, a thermoelectric conversion material which has high physical strength, stably exhibits high thermoelectric conversion performance, is not weathered, and has excellent durability and high stability and reliability can be obtained by pulverizing the $Mg_2Si_{1-x}Sn_x$ polycrystal obtained in the synthesis process, adding a certain amount of appropriate dopant to the resulting powder, and sintering the mixture by a pressurized sintering method under a reduced pressure atmosphere at a sintering pressure of 5 to 60 MPa at a sintering temperature of 600 to 1000° C.

It is preferable that particles having a fine and uniform particle size and a narrow particle size distribution be formed by pulverization. When the particles having a fine and uniform particle size and a narrow particle size distribution are sintered by the succeeding pressurized sintering method, at least part of the surfaces of the particles can be fused and sintered well. Therefore the particles can be sintered, and a sintered body having a density from about 70% of the theoretical density to nearly the theoretical density can be obtained.

Specific examples of the particle size of the pulverized $Mg_2Si$ or $Mg_2Sn$ may include the particle sizes which stay on a 65 μm sieve and passes through a 75 μm sieve, and which stay on a 20 μm sieve and passes through a 30 μm sieve, and an average particle diameter of 0.1 to 0.2 μm. It is preferable that the particles size be appropriately selected.

This is preferable since the sintered body having a density from about 70% to nearly the theoretical density can be obtained and the thermoelectric conversion material can be produced.

Specific examples of the dopant may include trivalent dopants such as B, Al, Ga, and In, doping a divalent Mg site.

$Mg_2Si$ or $Mg_2Sn$ used as an n-type thermoelectric conversion material can be produced by adding one or more kinds of the dopants in a required amount.

Other specific examples may include pentavalent dopants such as P and Bi, doping a tetravalent Si site. $Mg_2Si$ or $Mg_2Sn$ used as an n-type thermoelectric conversion material can be produced by adding one or more kinds of the dopants in a required amount.

Further, other specific examples may include monovalent dopants such as Ag, Cu, and Au, doping the divalent Mg site. $Mg_2Si$ or $Mg_2Sn$ used as a p-type thermoelectric conversion material can be produced by adding one or more kinds of the dopants in a required amount.

Furthermore, specific examples may include trivalent dopants such as B, Al, Ga, and In, doping the tetravalent Si site. $Mg_2Si$ or $Mg_2Sn$ used as a p-type thermoelectric conversion material can be produced by adding one or more kinds of the dopants in a required amount.

When the trivalent dopant such as B, Al, Ga, and In is doped at the divalent Mg site, $Mg_2Si$ or $Mg_2Sn$ used as an n-type thermoelectric conversion material can be produced, and when it is doped at the tetravalent Si site, $Mg_2Si$ or $Mg_2Sn$ used as a p-type thermoelectric conversion material can be produced. However, the substitution of the trivalent dopant with the divalent Mg site or the tetravalent Si or Sn site depends on synthesis processes or crystallinity of obtained samples.

The description of the above-described embodiments is to describe the present invention, and does not limit the invention described in the claims or restrict the scope thereof. Further, the components of the present invention are not limited to the above-described embodiments, and various changes can be made within the technical scope described in the claim.

EXAMPLES

Hereinafter, the present invention will be described in details with reference to Examples and Comparative Examples, however the present invention is not limited to these examples without departing from the spirit of the present invention.

Example 1

Synthesis of $Mg_2Si$ Polycrystal

As shown in FIG. 2(a), a starting material mixture (atomic composition ratio Mg:Si=2.03:1.00) comprising 3.804 g of Mg particles having a purity of 4 N (chunked material (average particle diameter: 2 to 3 mm)) and 2.196 g of Si particles having a purity of 5 N (chunked material (average particle diameter: 2 to 3 mm)) was placed in a crucible 3 made of alumina (alumina Tammann tube) with an inner diameter φ of 12 mm and a length of 11 cm. As shown in FIG. 2(b), ceramic fibers (brand name: bulk fiber FXL, available from Toshiba Monofrax Co. Ltd., color: white, maximum use temperature: 1260° C., average diameter of fibers: 2 to 4 μm, length of fibers: <80, true specific gravity: 2.73, specific heat: (kj/kg° C.), configuration phase of fiber: amorphous, chemical components: $Al_2O_3$ 48% by weight and $SiO_2$ 52% by weight) covered the starting material mixture 2 placed in the crucible 3 from above so as to have a packing density of 0.49/cm³ and a thickness of about 2 cm to form an inorganic fiber layer 6.

The crucible 3 was placed in an electric furnace (siliconit electric furnace) (heating means 8) which had been heated to 1150° C. (display temperature) by the control means 9 shown in FIG. 1 and heated for 15 minutes to melt the mixture. The crucible 3 was taken from the electric furnace (heating means 8), and rapidly cooled by natural cooling (about 30 minutes) in air. A growth crystal was taken from the crucible.

A time required for growth was about 50 minutes in total, including about 5 minutes for preparation of the crucible 3, 15 minutes for heating, and about 30 minutes for cooling.

The crystal taken after cooling was an $Mg_2Si$ polycrystal.

The $Mg_2Si$ polycrystal was taken after cooling, the amount of the inorganic fiber layer 6 made of ceramic fibers was measured. As a result, the weight of the inorganic fiber layer 6 was increased from about 1.1 g as an initial weight to about 1.6 g.

It is considered that the air permeability of the inorganic fiber layer 6 was caused to disappear by making the vaporized Mg moisten and adhere to the fiber surface of the inorganic fiber layer 6, and reacting the Mg with residual oxygen remaining in a space ranging from the upper face of the starting material 2 to the upper face of the inorganic fiber layer 6 and oxygen in inorganic fibers to form an oxide film of MgO and Mg—Si—O being a product 7 on the fiber surface, thereby blocking external oxygen.

Figure 6:
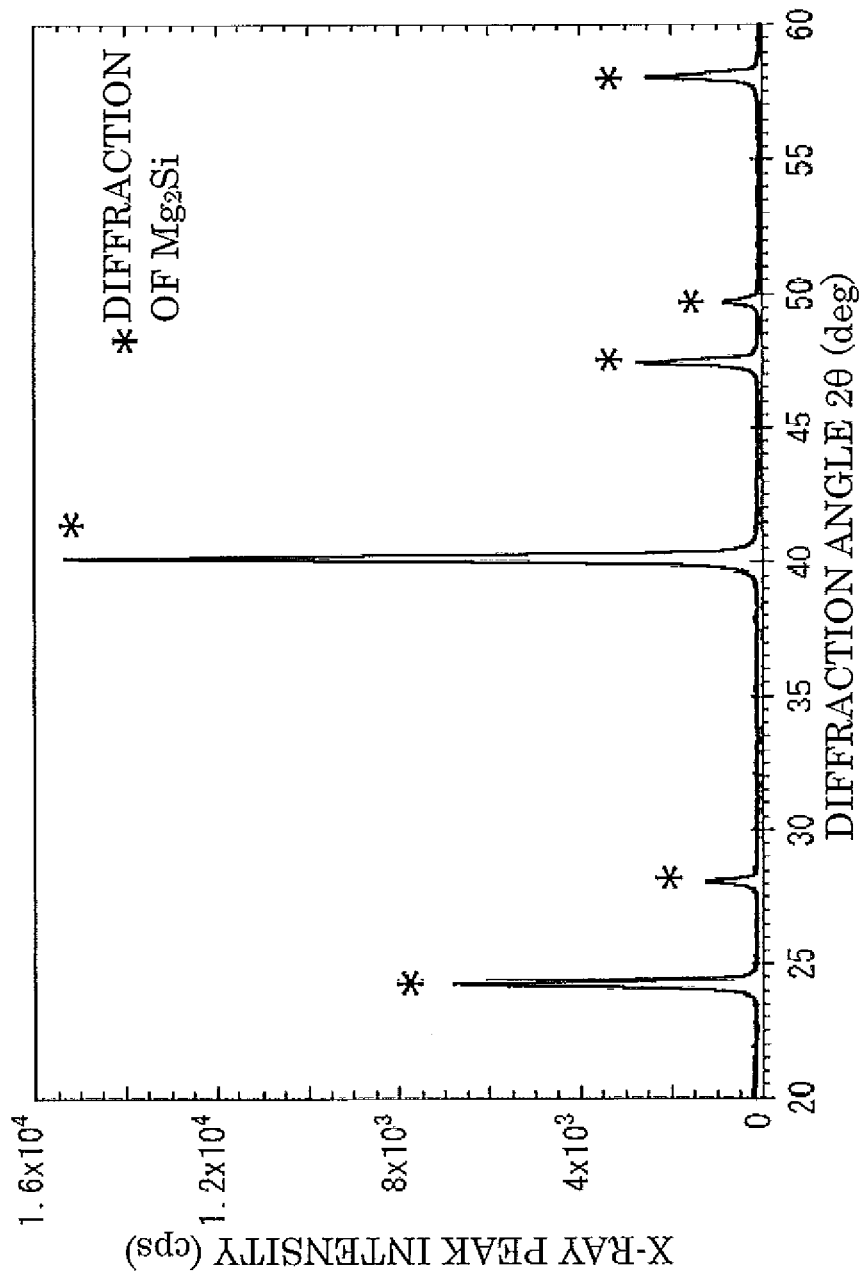
FIG. 6 is a graph showing the results of powder X-ray diffraction measurement of an $Mg_2Si$ polycrystal obtained in Example 1.

A result of powder X-ray diffraction measurement under the following measurement conditions is shown in FIG. 6.
(Measurement Conditions)
  Device: Rigaku RINT2000
  X-ray: CuKα1 40 kv/30 mA
  Divergence slit: 1°
  Scattering slit: 1°
  Receiving slit: 0.3 mm
  Scan mode: continuous
  Specimen rotating speed: 60 rpm
  Scan speed: 2°/min.
  Scan step: 0.02°
  Scan axis: Θ to 2Θ

As can be seen from FIG. 6, an $Mg_2Si$ polycrystal which did not contain unreacted Si and Mg could be synthesized.

Example 2

Synthesis of $Mg_2Sn$ Polycrystal

As shown in FIG. 2(a), a starting material mixture (atomic composition ratio Mg:Sn=2.03:1.00) comprising 1.90 g of Mg particles having a purity of 4 N (chunked material (average particle diameter: 2 to 3 mm)) and 4.64 g of Sn particles having a purity of 5 N (chunked material (average particle diameter: 2 to 3 mm)) was placed in a crucible 3 made of alumina (alumina Tammann tube) with an inner diameter φ of 12 mm and a length of 11 cm in the same manner as in Example 1. As shown in FIG. 2(b), ceramic fibers (brand name: bulk fiber FXL, available from Toshiba Monofrax Co. Ltd., color: white, maximum use temperature: 1260° C., average diameter of fibers: 2 to 4 μm, length of fibers: <80, true specific gravity: 2.73, specific heat: (kj/kg° C.), configuration phase of fiber: amorphous, chemical components: $Al_2O_3$ 48% by weight and $SiO_2$ 52% by weight) covered the starting material mixture 2 placed in the crucible 3 from above so as to have a packing density of 0.49/cm³ and a thickness of about 2 cm to form an inorganic fiber layer 6.

The crucible 3 was placed in an electric furnace (siliconit electric furnace) (heating means 8) which had been heated to 800° C. (display temperature) by the control means 9 shown in FIG. 1 and heated for 60 minutes to melt the mixture. The crucible 3 was taken from the electric furnace (heating means 8), and rapidly cooled by natural cooling (about 30 minutes) in air. A growth crystal was taken from the crucible.

The time required for growth was about 95 minutes in total, including about 5 minutes for preparation of the crucible 3, 60 minutes for heating, and about 30 minutes for cooling.

The crystal taken after cooling was an $Mg_2Sn$ polycrystal.

Figure 7:
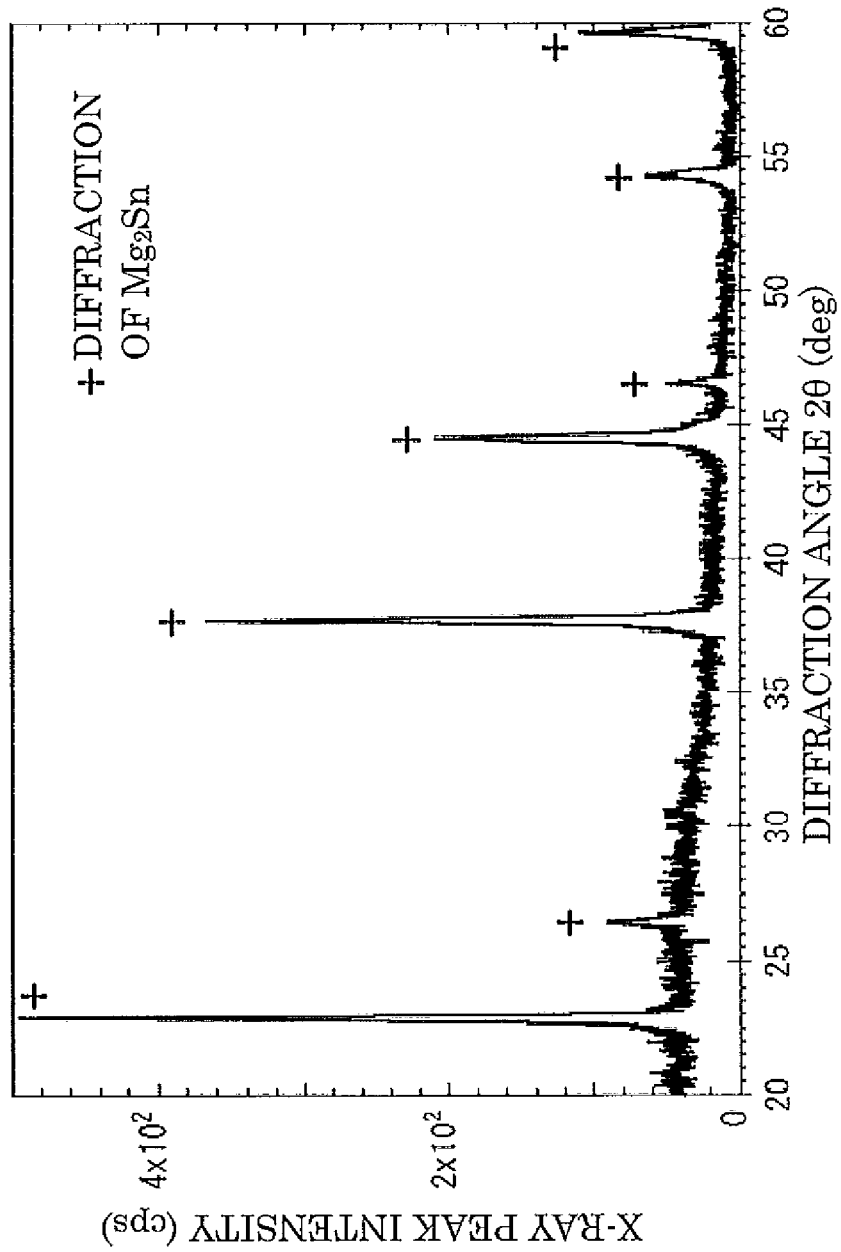
FIG. 7 is a graph showing the results of powder X-ray diffraction measurement of an $Mg_2Sn$ polycrystal obtained in Example 2.

As in Example 1, a result of powder X-ray diffraction measurement is shown in FIG. 7. As can be seen from FIG. 7, an $Mg_2Sn$ polycrystal which did not contain unreacted Si and Mg could be synthesized.

Example 3

Synthesis of an $Mg_2Si_{1-x}Sn_x$ Polycrystal

In the same manner as in Example 1, as shown in FIG. 2(a), a starting material mixture 2 (atomic composition ratio Mg:Si:Sn=2.03:0.8:0.2) (composition wherein x=0.2) comprising 1.90 g of Mg particles having a purity of 4 N (chunked material (average particle diameter: 2 to 3 mm)), 0.88 g of Si particles having a purity of 5 N (chunked material (average particle diameter: 2 to 3 mm)), and 0.93 g of Sn particles having a purity of 5 N (chunked material (average particle diameter: 2 to 3 mm)) was placed in a crucible 3 made of alumina (alumina Tammann tube) with an inner diameter ϕ of 12 mm and a length of 11 cm. As shown in FIG. 2(b), ceramic fibers covered the starting material mixture 2 placed in the crucible 3 from above so as to have a packing density of 0.49/cm$^3$ and a thickness of about 2 cm to form an inorganic fiber layer 6.

The crucible 3 was placed in an electric furnace (siliconit electric furnace) (heating means 8) which had been heated to 1150° C. (display temperature) by the control means 9 shown in FIG. 1 and heated for 30 minutes to melt the mixture. The crucible 3 was taken from the electric furnace (heating means 8), and rapidly cooled by natural cooling (about 30 minutes) in air. A growth crystal was taken from the crucible.

The time required for growth was about 65 minutes in total, including about 5 minutes for preparation of the crucible 3, 30 minutes for heating, and about 30 minutes for cooling.

The crystal taken after cooling was an $Mg_2Si_{1-x}Sn_x$ polycrystal.

Figure 8:
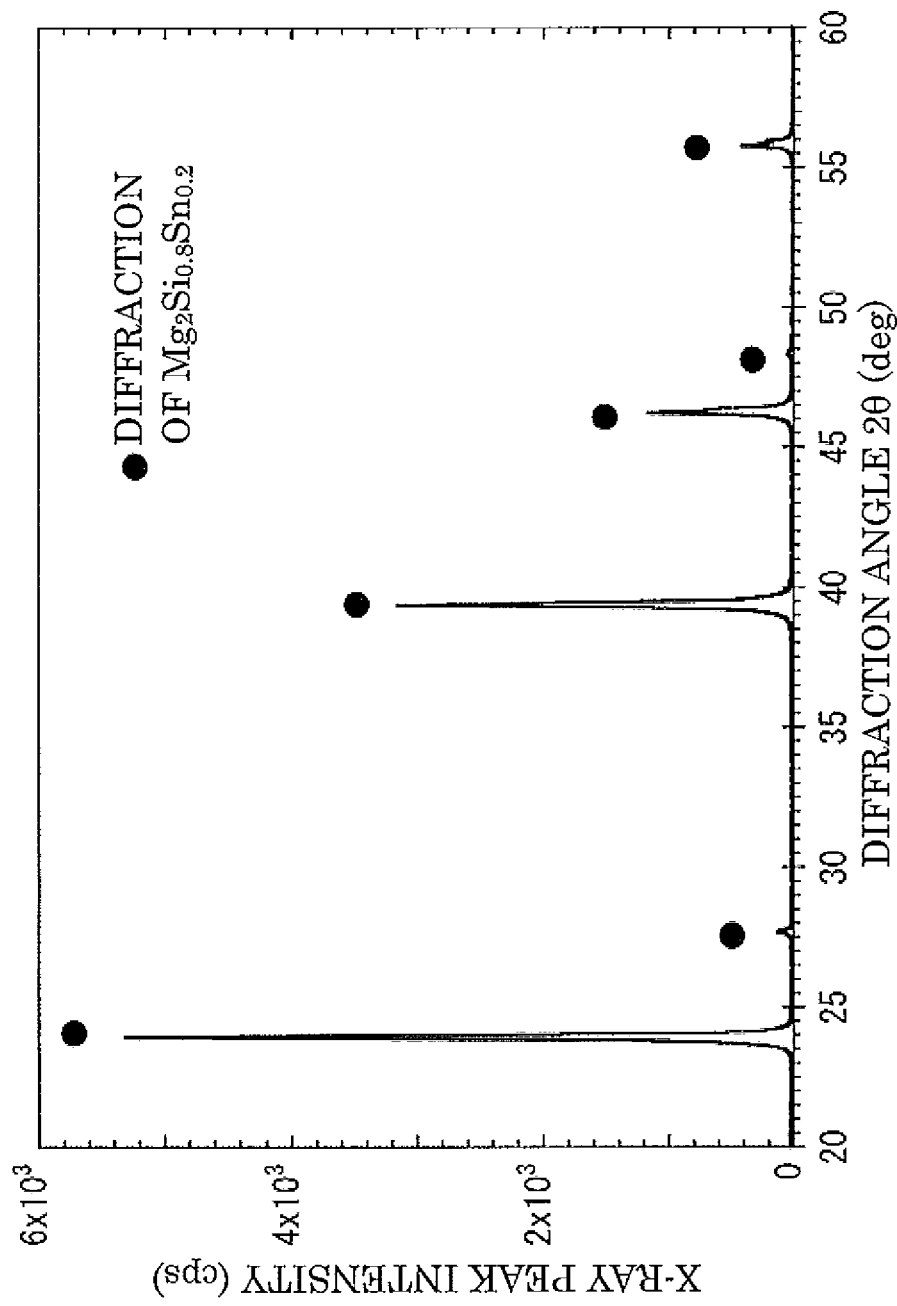
FIG. 8 is a graph showing the results of powder X-ray diffraction measurement of an $Mg_2Si_{0.8}Sn_{0.2}$ polycrystal obtained in Example 3.

As in Example 1, a result of powder X-ray diffraction measurement is shown in FIG. 8.

As can be seen from FIG. 8, an $Mg_2Si_{1-x}Sn_x$ polycrystal which did not contain unreacted Si and Mg could be synthesized.

Comparative Example 1

A growth crystal was taken in the same manner as in Example 1 except that an inorganic fiber layer 6 was not formed and a crucible was placed in an electric furnace (siliconit electric furnace) (heating means 8) and heated for 30 minutes.

Specifically, a starting material mixture 2 (atomic composition ratio Mg:Si=2.03:1.00) comprising 3.804 g of Mg particles having a purity of 4 N (chunked material (average particle diameter: 2 to 3 mm)) and 2.196 g of Si particles having a purity of 5 N (chunked material (average particle diameter: 2 to 3 mm)) was placed in a crucible 3 made of alumina (alumina Tammann tube) with an inner diameter ϕ of 12 mm and a length of 11 cm without forming an inorganic fiber layer 6 shown in FIG. 1.

Without forming the inorganic fiber layer 6, the crucible 3 was placed in an electric furnace (siliconit electric furnace) (heating means 8) which had been heated to 1150° C. (display temperature) by the control means 9 shown in FIG. 1 and heated for 30 minutes to melt the mixture. The crucible 3 was taken from the electric furnace (heating means 8), and rapidly cooled by natural cooling (about 30 minutes) in air. A growth crystal was taken from the crucible.

The time required for growth was about 65 minutes in total, including about 5 minutes for preparation of the crucible 3, 30 minutes for heating, and about 30 minutes for cooling.

The crystal taken after synthesis and cooling was a brown to gray powder. From the color of the powder, it is assumed that a powder of magnesium oxide and silicon oxide or oxides reacted with these are synthesized.

Explosion and rapid combustion did not particularly occur. It is considered that this is because the upper part of the electric furnace (siliconit electric furnace) (heating means 8) is exposed to air and the vaporized Mg is reacted with oxygen without convection.

Figure 11:
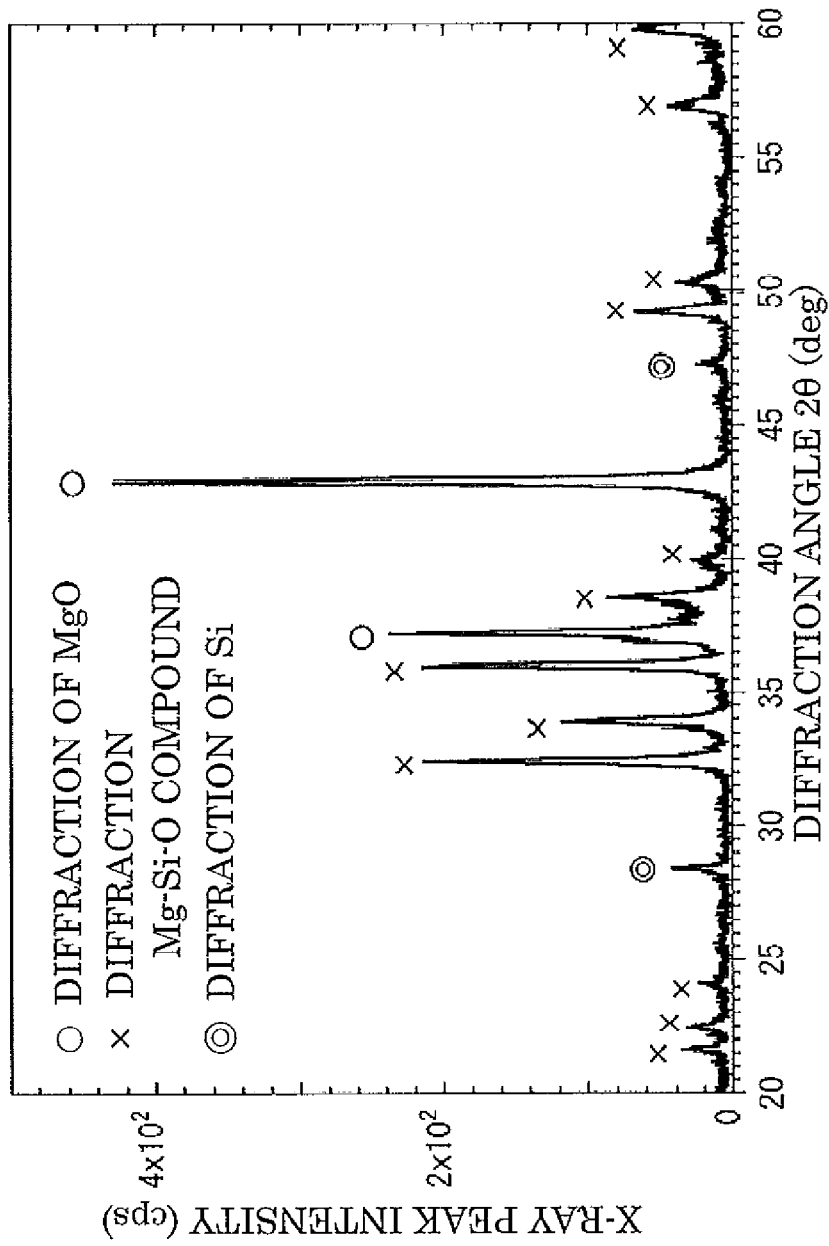
FIG. 11 is a graph showing the results of powder X-ray diffraction measurement of a product obtained in Comparative Example 1.

As in Example 1, a result of powder X-ray diffraction measurement is shown in FIG. 11. In FIG. 11, peaks of main components, MgO and MgSiO, are observed. A very small peak of Si is observed.

Example 4

Synthesis of $Mg_2Si$ Polycrystal

As shown in FIG. 3(a), a starting material mixture 2 (atomic composition ratio Mg:Si=2.03:1.0) comprising 3.804 g of Mg particles having a purity of 4 N (chunked material (average particle diameter: 2 to 3 mm)) and 2.196 g of Si particles having a purity of 5 N (chunked material (average particle diameter: 2 to 3 mm)) was placed in a crucible 3 made of alumina (alumina Tammann tube) with an inner diameter ϕ of 12 mm and a length of 11 cm in the same manner as in Example 1.

As shown in FIG. 3(b-1), ceramic fibers covered the starting material mixture 2 placed in the crucible 3 from above so as to have a packing density of 0.49/cm$^3$ and a thickness of about 1 cm, and was packed without spaces between the ceramic fibers and the crucible 3 to form a lower inorganic fiber layer 6-1 having air permeability.

As shown in FIG. 3(b-2), 0.2 g of Mg particles 13 were disposed on the whole surroundings of portions which are above the lower inorganic fiber layer 6-1 and in which the lower inorganic fiber layer comes into contact with the inner wall face of a reaction vessel 3. Ceramic fibers which was the same as the lower inorganic fiber layer 6-1 covered the lower inorganic fiber layer from above so as to have a packing density of 0.49/cm$^3$ and a thickness of about 1 cm, and was packed without spaces between the ceramic fibers and the crucible 3 to fixedly provide an upper inorganic fiber layer 6-2 having air permeability.

The crucible 3 was placed in an electric furnace (siliconit electric furnace) (heating means 8) which had been heated to 1150° C. (display temperature) by the control means 9 shown in FIG. 1 and heated for 15 minutes to melt the mixture. The crucible 3 was taken from the electric furnace (heating means 8), and rapidly cooled by natural cooling (about 30 minutes) in air. A growth crystal was taken from the crucible.

The time required for growth was about 50 minutes in total, including about 5 minutes for preparation of the crucible 3, 15 minutes for heating, and about 30 minutes for cooling.

The crystal taken after cooling was an $Mg_2Si$ polycrystal.

During the test, the inorganic fiber layer 6 was fixed well. It was not found that the inorganic fiber layer 6 rose, moved, and dropped, and Mg vapor leaked from a gap between the inorganic fiber layer 6 and the crucible 3 in the test.

Figure 9:
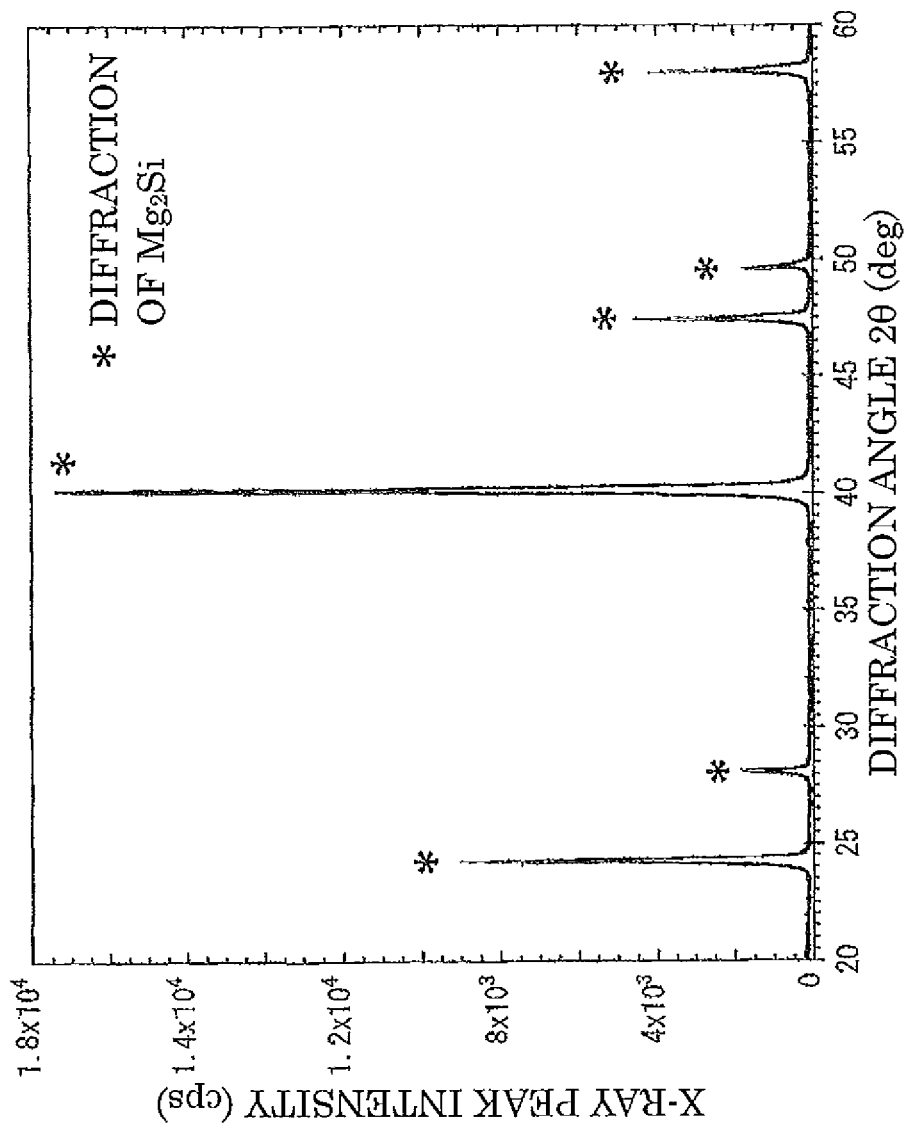
FIG. 9 is a graph showing the results of powder X-ray diffraction measurement of an $Mg_2Si$ polycrystal obtained in Example 4.

As in Example 1, a result of powder X-ray diffraction measurement is shown in FIG. 9.

As can be seen from FIG. 9, an Mg$_2$Si polycrystal which did not contain unreacted Si and Mg could be synthesized.

Example 5

Synthesis of Mg$_2$Si Polycrystal

As shown in FIG. 4(a-1), a release layer 14 made of a carbon sheet and having a thickness of 0.2 mm and heat resistance was provided in a crucible 3 made of alumina (alumina Tammann tube) with an inner diameter φ of 12 mm and a length of 11 cm, at least on the inner wall in which the crucible 3 was in contact with a starting material 2, in the same manner as in Example 1. As shown in FIG. 4(a-2), a reaction vessel 3 provided with the release layer 14 was filled with a predetermined amount of the starting material 2, and another release layer 14 made of a circular carbon sheet and having a thickness of 0.2 mm and heat resistance was provided on the packed starting material 2.

The starting material mixture 2 (atomic composition ratio Mg:Si=2.03:1.0) comprising 3.804 g of Mg particles having a purity of 4 N (chunked material (average particle diameter: 2 to 3 mm)) and 2.196 g of Si particles having a purity of 5 N (chunked material (average particle diameter: 2 to 3 mm)) was placed.

As shown in FIG. 4(b), ceramic fibers covered the starting material mixture 2 placed in the crucible 3 from above so as to have a packing density of 0.49/cm$^3$ and a thickness of about 2 cm, and was packed without spaces between the ceramic fibers and the crucible 3 to form an inorganic fiber layer 6 having air permeability.

The crucible 3 was placed in an electric furnace (siliconit electric furnace) (heating means 8) which had been heated to 1150° C. (display temperature) by the control means 9 shown in FIG. 1 and heated for 15 minutes to melt the mixture. The crucible 3 was taken from the electric furnace (heating means 8), and rapidly cooled by natural cooling (about 30 minutes) in air. A growth crystal was taken from the crucible.

The time required for growth was about 50 minutes in total, including about 5 minutes for preparation of the crucible 3, 15 minutes for heating, and about 30 minutes for cooling.

The crystal taken after cooling was an Mg$_2$Si polycrystal.

Figure 10:
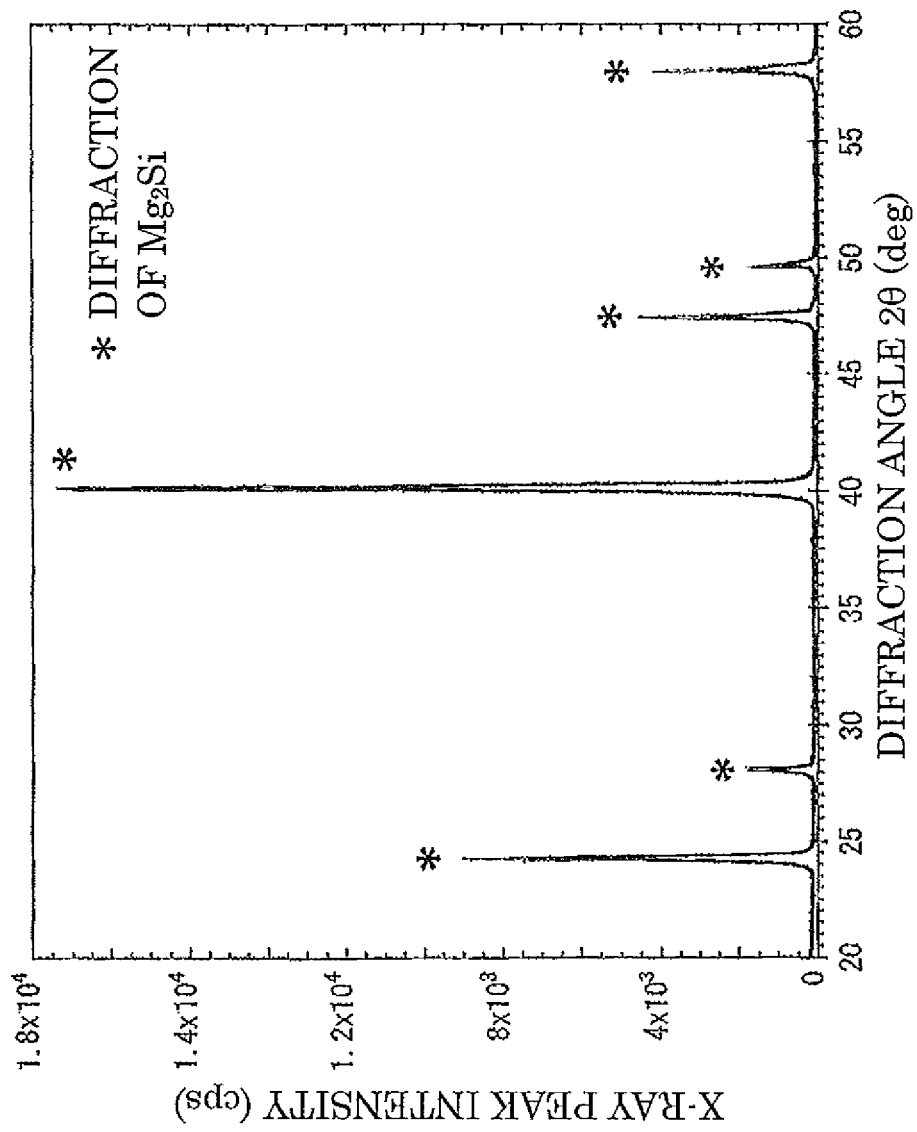
FIG. 10 is a graph showing the results of powder X-ray diffraction measurement of an $Mg_2Si$ polycrystal obtained in Example 5.

As with Example 1, a result of powder x-ray diffraction measurement is shown in FIG. 10.

As can be seen from FIG. 10, an Mg$_2$Si polycrystal which did not contain unreacted Si and Mg could be synthesized.

INDUSTRIAL APPLICABILITY

The apparatus for producing an Mg$_2$Si$_{1-x}$Sn$_x$ of the present invention can produce an Mg$_2$Si$_{1-x}$Sn$_x$ polycrystal with ease and safe in a short time without using an expensive vacuum device, an inert gas introduction device, a sealing device, or the like. The Mg$_2$Si$_{1-x}$Sn$_x$ polycrystal has remarkable effects such as effective utilization as an inexpensive thermoelectric conversion material that can be expected to have a high performance index and a long life span by adding a certain amount of dopant and firing, if necessary. An Mg$_2$Si$_{1-x}$Sn$_x$ polycrystal can be produced in air in accordance with the steps (1) to (8) using the production apparatus of the present invention. Therefore, the production method has remarkable effects in which the Mg$_2$Si$_{1-x}$Sn$_x$ polycrystal can be produced with ease and safe in a short time without using an expensive vacuum device, an inert gas introduction device, a sealing device, or the like. Accordingly, the present invention has high industrial utility values.

REFERENCE SIGNS LIST 1 production apparatus
2 starting material
3 reaction vessel
4 heat resistant cover
5 space
6 inorganic fiber layer
6-1 lower inorganic fiber layer
6-2 upper inorganic fiber layer
7 product
8 heating means
9 control means
10 opening part
11 Mg$_2$Si or Mg$_2$Sn melt
12 Mg$_2$Si or Mg$_2$Sn polycrystal
13 Mg particles
14 release layer
15 product

The invention claimed is:

1. An apparatus for producing an Mg$_2$Si$_{1-x}$Sn$_x$ polycrystal, comprising at least:
   a reaction vessel for synthesizing an Mg$_2$Si$_{1-x}$Sn$_x$ polycrystal represented by the following formula (1) by charging a mixture of one of Mg particles and Si particles, or Mg particles and Sn particles, or Mg—Si alloy particles, or Mg—Sn alloy particles, or Mg particles and Si particles and Sn particles as a starting material to cause a chemical reaction;
   an inorganic fiber layer which is fixedly provided above the starting material charged into the reaction vessel and is permeable to air, until a product of MgO and Mg—Si—O generated by chemical reaction of vaporized Mg with residual oxygen and oxygen in inorganic fibers blocks oxygen permeation through the inorganic fiber layer during the synthesis of the polycrystal;
   heating means for heating the reaction vessel; and
   control means for controlling a heating temperature and heating time of the reaction vessel, $$Mg_2Si_{1-x}Sn_x \qquad (1)$$

in the formula (1), x is 0 to 1.

2. The production apparatus according to claim 1, wherein:
   the inorganic fiber layer includes an upper inorganic fiber layer and a lower inorganic fiber layer, a portion of each of the upper and the lower inorganic fiber layers being in contact with an inner wall face of the reaction vessel; and
   Mg particles disposed between the upper and lower inorganic fiber layers including between the portions of the upper and lower inorganic fiber layers being in contact with the inner wall face of the reaction vessel.

3. The production apparatus according to claim 1, wherein:
   the reaction vessel has a release layer on an inner wall face of the reaction vessel; and
   wherein the release layer is in contact with at least the starting material.

4. The production apparatus according to claim 1, wherein the reaction vessel has a release layer provided on the starting material such that the release layer covers the starting material.

5. A method for producing an Mg$_2$Si$_{1-x}$Sn$_x$ polycrystal, represented by the following formula (1), in air using the production apparatus according to claim 1 in accordance with the following steps (1) to (8):
   (1) preparing a starting material which contains a mixture of one of Mg particles and Si particles, or Mg particles and Sn particles, or Mg—Si alloy particles, or Mg—Sn alloy particles, or Mg particles and Si particles and Sn particles so as to have an element ratio in the mixture of Mg :Si or Sn of (2+α): 1, wherein α corresponds to an amount of Mg of 0.1% to 1% by mole Mg;

(2) charging the starting material prepared in the step (1) into the reaction vessel;

(3) providing an inorganic fiber layer above the starting material charged into the reaction vessel, wherein the inorganic fiber layer has air permeability;

(4) heating the whole reaction vessel having the inorganic fiber layer formed in the step (3) and raising the reaction vessel to approximately 650° C., which is the melting point of Mg, for at least 3 minutes to discharge outside of the production apparatus air existing in a space ranging from an upper face of the starting material to an upper face of the inorganic fiber layer;

(5) further heating the whole reaction vessel for at least 4 minutes to a temperature equal to or lower than a maximum use temperature of the inorganic fiber layer to react vaporized Mg with a residual oxygen and oxygen in inorganic fibers and a product of MgO and Mg—Si—O generated by the chemical reaction blocks oxygen permeation through the inorganic fiber layer, wherein the maximum use temperature of the inorganic fiber layer is a temperature equal to or lower than 1600° C., and wherein the inorganic fiber layer includes at least one kind of inorganic fiber containing $SiO_2$;

(6) continuously heating the whole reaction vessel for at least 5 minutes to maintain the whole reaction vessel at the temperature equal to or lower than the maximum use temperature of the inorganic fiber layer to react Mg with Si or Sn to produce a melt of the $Mg_2Si_{1-x}Sn_x$ polycrystal;

(7) cooling the melt of the $Mg_2Si_{1-x}Sn_x$ polycrystal produced in the step (6) for at least 10 minutes to precipitate the $Mg_2Si_{1-x}Sn_x$ polycrystal; and (8) taking the $Mg_2Si_{1-x}Sn_x$ polycrystal precipitated in the step (7) from the reaction vessel, (1) wherein the $Mg_2Si_{1-x}Sn_x$ polycrystal has the formula: $Mg_2Si_{1-x}Sn_x$ wherein in the formula (1), x is 0 to 1.

6. The production method according to claim 5, wherein:
the reaction vessel is impervious to oxygen, and
the reaction vessel is resistant to heat produced by the chemical reaction of Mg with Si or Sn in air, and
the reaction vessel does not supply impurities to the precipitated $Mg_2Si_{1-x}Sn_x$ polycrystal.

7. The production method according to claim 5, wherein a total of the step (4), step (5), step (6) and step (7) are conducted in a range of 15 minutes to 4 hours.

8. The production method according to claim 5, wherein the step (6) includes reacting Mg with Si or Sn by stiffing to produce the melt of the $Mg_2Si_{1-x}Sn_x$ polycrystal.

9. The production method according to claim 5, wherein the step (3) of providing the inorganic fiber layer includes providing an upper inorganic fiber layer and a lower inorganic fiber layer, a portion of each of the upper and lower inorganic fiber layers being in contact with an inner wall face of the reaction vessel, and providing Mg particles disposed between the upper and lower inorganic fiber layers including between the portion of each of the upper and lower inorganic fibers being in contact with the inner wall face of the reaction vessel.

10. The production method according to claim 5, wherein the reaction vessel has a release layer formed on an inner wall face of the reaction vessel in contact with at least the starting material.

11. The production method according to claim 5, wherein the step (2) of charging the reaction vessel with the starting material prepared in the step (1) into the reaction vessel includes providing a release layer on the starting material so as to cover the whole starting material.

12. The production apparatus according to claim 2, wherein:
the reaction vessel has a release layer formed on an inner wall face of the reaction vessel in contact with at least the starting material; and
the release layer is provided on an upper surface of the starting material such that the release layer covers the starting material.

13. The production method according to claim 6, wherein:
a total of the steps of (4), (5), (6) and (7) are conducted in a range of 15 minutes to 4 hours;
the step (6) includes reacting Mg with Si or Sn by stirring to produce the melt of the $Mg_2Si_{1-x}Sn_x$ polycrystal;
the reaction vessel has a release layer formed on an inner wall face of the reaction vessel in contact with at least the starting material; and
the step (2) of charging the reaction vessel with the starting material prepared in the step (1)includes providing the release layer on an upper surface of the starting material such that the release layer covers the starting material; and
the step (3) of providing the inorganic fiber layer includes providing an upper inorganic fiber layer and a lower inorganic fiber layer, a portion of each of the upper and lower inorganic fiber layers being in contact with an inner wall face of the reaction vessel including the release layer formed thereon, and providing Mg particles disposed between the upper and lower inorganic fiber layers including between the portions being in contact with the inner wall face of the reaction vessel including the release layer formed thereon.

* * * * *